United States Patent Office 3,429,795

Patented Feb. 25, 1969

3,429,795

PHOTOPOLYMERISATION OF ETHYLENICALLY UNSATURATED ORGANIC COMPOUNDS USING A CARBOXYLIC DITHIOCARBAMIC ANHYDRIDE AS A PHOTOINITIATOR

Gerard Albert Delzenne and Urbain Leopold Laridon, Wilrijk-Antwerp, Belgium, assignors to Gevaert-AGFA N.V. Mortsel, Belgium, a Belgian company No Drawing. Filed May 2, 1967, Ser. No. 635,359

Claims priority, application Great Britain, May 23, 1966, 22,929/66

U.S. Cl. 204—159.24 8 Claims

Int. Cl. C08f *1/16, 1/76*

ABSTRACT OF THE DISCLOSURE

Ultraviolet photopolymerization of ethylenically unsaturated organic compounds where in a carboxylic dithiocarbamic anhydride is employed as a photoinitiator, said radiation being in the range of 2500 to 5000 angstroms.

The present invention relates to the photopolymerisation of ethylenically unsaturated organic compounds and to polymers obtained therefrom.

The photopolymerisation of ethylenically unsaturated organic compounds can be initiated by exposure to high intensity radiation such as ultraviolet rays. Methyl acrylate, for instance, on long standing in sun light is transformed into a transparent mass (cf. Ellis: The Chemistry of Synthetic Resins, vol. II (1935), page 1072). Polymerisation however, by the use of light alone, proceeds at a very much slower rate when compared to polymerisation brought about by a free radical generating catalyst or by heat. Moreover, the use of light alone, unaided by other agents, requires very long exposure times in order to polymerise the monomer sufficiently. Furthermore, the low rate of polymerisation necessitates the use of extremely intense radiations such as those obtained from high intensity carbon arcs.

A lot of photopolymerisation initiators, which under the influence of actinic light increase the photopolymerisation rate, have already been described. A survey of such photopolymerisation initiators has been given by G. Delzenne in Industrie Chemique Belge, 24 (1959) 739–764.

An object of the present invention is to provide a new class of photopolymerisation initiators which can be activated by actinic light.

Another object of the present invention is to provide a new class of photopolymerisation initiators which require a short exposure to actinic light.

A further object is to provide a process whereby the photopolymerisation of ethylenically unsaturated organic compounds can be carried out at a practicable rate by visible light as well as by ultraviolet light.

Other objects will appear hereinafter.

According to the present invention a process is provided for the photopolymerisation of ethylenically unsaturated organic compounds, which process comprises irradiating with light of wavelengths ranging from 2500 to 5000 angstroms a composition comprising a photopolymerisable ethylenically unsaturated organic compound and as a photopolymerisation initiator a carboxylic dithiocarbamic anhydride of the formula:

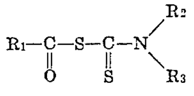

wherein $R_1$ represents a phenyl group, a naphthyl group, or a styryl group, and each of $R_2$ and $R_3$ (same or different) represents a hydrogen atom, a methyl group or an ethyl group.

The quantity of carboxylic dithiocarbamic anhydride to be used as photopolymerisation initiator will of course be dependent upon many variables including the particular carboxylic dithiocarbamic anhydride used, the wavelength of light employed, the irradiation time and the monomer or monomers present. Usually the amount of carboxylic dithiocarbamic anhydride is within the range of 0.01 to 5% by weight based on the monomeric material initially present. It is seldom necessary to employ more than 0.2 to 2% by weight to obtain a good polymerisation rate.

The ethylenically unsaturated organic compounds may be exposed to any source of radiation providing radiations of wavelengths in the range of 2500–5000 angstroms, preferably in the wavelength region of 3000–4000 angstroms. With certain carboxylic dithiocarbamic anhydrides having a higher absorption maximum even radiations of wavelengths above 5000 angstroms may be used. Suitable light sources include carbon arcs, mercury vapour lamps, fluorescent lamps, argon glow lamps, photographic flood lamps and tungsten lamps. Moreover, ordinary daylight may also be used.

The photopolymerisation can be carried out by any of the well-known processes, such as bulk, emulsion, suspension and solution polymerisation processes. In all of these processes, the addition of a carboxylic dithiocarbamic anyhdride according to the invention to polymerisable materials subjected to the action of actinic light greately increase the rate of photopolymerisation.

A base or support may be coated with a solution of the ethylenically unsaturated organic compound in a solvent therefor, this solution containing in dissolved state or homogeneously dispersed therein a photopolymerisation-initiating carboxylic dithiocarbamic anhydride, whereupon the solvent or solvent mixture is eliminated by known means such as evaporation, leaving a more or less thin coating of the ethylenically unsaturated organic compound on the base or support. Thereafter the dried photopolymersiable coating is exposed to actinic light rays.

When exposing the photopolymerisable composition to actinic light rays the polymerisation does not start immediately. Only after a short period, which among others depends on the ethylenically unsaturated organic composition, the photopolymerisation initiator and the light intensity used, the photopolymerisation starts. The period necessary for obtaining a perceptible amount of polymerisation is a measure of the efficiency of the photopolymerisation initiator, and is named the inhibition period.

In some circumstances it may be desirable that the photopolymerisable composition comprises a hydrophilic or hydrophobic colloid as carrier or binding agent for the ethylenically unsaturated organic compound and the photopolymerisation initiating carboxylic dithiocarbamic anhydride. By the presence of this binding agent the properties of the light-sensitive layer are of course highly influenced. The choice of the binding agent is dependent on its solubility in solvents, which can also be used as solvents for the ethylenically unsaturated organic compounds and for the carboxylic dithiocarbamic anhydride of the invention. Such binding agents are for instance poly (styrene), poly(methyl methacrylate), poly(vinyl acetate), poly(vinylbutyral), partially saponified cellulose acetate and other polymers that are soluble in solvents for initiators and monomers. In some circumstances water-soluble polymers can be used such as gelatin, casein, starch, carboxymethylcellulose and poly(vinyl alcohol). It is evident that the ratio of photopolymerisable composition to binding agent also influences the photopolymerisation. The larger this ratio, the higher the photopolymerisation rate generally will be for one and the same ethylenically unsaturated organic compound.

If the photopolymerisable composition is water-soluble water may be used as solvent for coating the support. On the contrary, if water-insoluble photopolymerisable compositions are used, organic solvents, mixtures of organic solvents or mixtures of organic solvents and water may be used.

Examples of carboxylic dithiocarbamic anhydrides, which can be used as photopolymerisation initiators, are:

benzoic-methyldithiocarbamic anhydride,
α-naphthoic-methyldithiocarbamic anhydride,
cinnamic-methyldithiocarbamic anhydride,
benzoic-ethyldithiocarbamic anhydride,
benzoic-dimethyldithiocarbamic anhydride.

The process of the invention is applied to the photopolymerisation of compositions comprising ethylenically unsaturated organic compounds. These compositions may comprise one or more ethylenically unsaturated polymerisable compounds such as styrene, acrylamide, methacrylamide, methyl methacrylate and acrylonitrile. When two of these monomers are used in the same photopolymerisable composition or if they are mixed with other polymerisable compounds, copolymers are formed during the photopolymerisation. It is further presumed that in the case where the photopolymerisable material is used together with a polymeric binding agent, graft copolymers are formed between the polymeric binder and the photopolymerised material.

The photopolymerisable composition may also comprise or consist of unsaturated compounds having more than one carbon-to-carbon double bond, e.g., two terminal vinyl groups, or of a polymeric compound having ethylenic unsaturation. During polymerisation of these compositions usually cross-linking will occur by means of the plurally unsaturated compound. Examples of compounds containing more than one carbon-to-carbon double bond are, e.g., divinylbenzene, diglycol diacrylates and N,N'-alkylene-bisacrylamides. Examples of polymeric compounds containing ethylenic unsaturation are, e.g., allyl esters of polyacrylic acid, maleic esters of polyvinyl alcohol, polyhydrocarbons still containing carbon-to-carbon double bonds, unsaturated polyesters, cellulose acetomaleates, and allylcellulose.

In the photopolymerisation of ethylenically unsaturated compounds with carboxylic dithiocarbamic anhydrides of the invention high temperatures are not needed. The exposure, however, to strong light sources at a relatively short distance, brings about a certain heating of the mass to be polymerised, which heating exercises a favourable influence upon the polymerisation rate.

The photopolymerisable compositions which contain carboxylic dithiocarbamic anhydrides are useful in the preparation of photographic images.

The products of the invention are useful as adhesives, coating and impregnating agents, safety glass interlayers, etc. When photopolymerisation of the compositions is carried out within a mold, optical articles such as lenses can be obtained.

The present invention also comprises spreading the polymerisable composition upon a surface such as a surface of metal and printing a design thereon photographically by exposure to light through a suitable image pattern. Hereby the light induces polymerisation in the exposed areas of the photopolymerisation composition whereby the polymeric layer is rendered insoluble in the solvent or solvents used for applying the photopolymerisable layer. Thereafter the nonexposed areas are washed away with a solvent for the monomeric material. In this way printing plates and photographic resist images are manufactured, which can be further used as planographic printing plates, as matrices for printing matter, as screens for silk screen printing, and as photoresists for etching.

The imagewise photopolymerisation can also induce differential softening properties to the layer. This makes possible a reproduction process by material transfer when the imagewise photopolymerised layer is subsequently warmed up and pressed against a receiving sheet, so that the softened areas are transferred to the receiving sheet.

The following examples illustrate the present invention.

Example 1

In a glass tube 9.36 g. (10 ccs.) of methyl methacrylate are dissolved in 10 ccs. of benzene. To this solution is added as an initiator $2\times10^{-2}$ mol of benzoic-methyldithiocarbamic anhydride per litre. The oxygen is expelled from the tube by bubbling nitrogen through the solution for 20 to 30 minutes. Then the glass tube is sealed by melting.

As a comparison the same solution is prepared in a same glass tube, but no initiator is added.

Both glass tubes are irradiated by means of a 300 watt high pressure mercury vapour lamp placed at a distance of 25 cm. During this irradiation the tubes are cooled by means of a ventilator. Then the contents of the tubes are poured in methanol, whereupon the precipitated polymer is collected, dried and weighed.

After an exposure time of 2 hours only 0.46% of the monomeric methyl methacrylate in the comparison tube has been polymerised. The amounts of polymerised monomer in the tube containing the initiator are given in the following table:

| Exposure time in minutes: | Amount of polymer in percent by weight |
|---|---|
| 45 | 6.28 |
| 90 | 12.31 |
| 120 | 16.50 |
| 150 | 19.46 |
| 180 | 23.79 |

By plotting these polymer yields against time and by extrapolating graphically the polymer yields to the origin, no inhibition period is observed. This indicates the quite good efficiency of this initiator.

Example 2

Example 1 is repeated after the initiator has been replaced by a same amount of α-naphthoic-methyldithiocarbamic anhydride. The results are the following.

| Exposure time in minutes: | Amount of polymer in percent by weight |
|---|---|
| 60 | 9.09 |
| 120 | 15.76 |
| 180 | 24.87 |

By plotting and extrapolating as has been done in Example 1 no inhibition period is observed, which indicates the quite good efficiency of the initiator.

Example 3

Example 1 is repeated after the initiator has been replaced by a same amount of cinnamic-methyldithiocarbamic anhydride. Distance of the light source; 18 cm. The results are the following:

| Exposure time in minutes: | Amount of polymer in percent by weight |
|---|---|
| 60 | 3.06 |
| 120 | 4.79 |
| 180 | 8.6 |
| 240 | 11.05 |
| 300 | 12.71 |

By plotting and extrapolating as has been done in Example 1 no inhibition period is observed, which indicates the quite good efficiency of the initiator.

Example 4

In a glass tube 9.05 g. of styrene are dissolved in 10 ccs. of benzene. To this solution is added as an initiator $5 \times 10^{-2}$ mol of benzoic-methyldithiocarbamic anhydride per litre. The oxygen is expelled from the tube by bubbling nitrogen through the solution for 30 minutes. Then the glass tube is sealed by melting.

As a comparison the same solution is prepared in a same glass tube, but no initiator is added.

The first glass tube and the comparison glass tubes are irradiated by means of a 300 watt high pressure mercury vapour lamp placed at a distance of 18 and 25 cm. respectively. Then the contents of the tubes are poured in methanol, whereupon the precipitated polymer is collected, dried and weighed.

After an exposure time of 2 hours only 1.48% of the monomeric styrene in the comparison tube has been polymerised. The amounts of polymerised monomer in the tube containing the initiator are given in the following table.

| Exposure time in minutes: | Amount of polymer in percent by weight |
|---|---|
| 60 | 2.67 |
| 120 | 5.21 |
| 180 | 8.61 |
| 240 | 10.57 |
| 300 | 18.57 |

By plotting these polymer yields against time and by extrapolating graphically the polymer yields to the origin, no inhibition period is observed. This indicates the quite good efficiency of this initiator.

Example 5

Example 4 is repeated after the styrene has been replaced by a same amount (10 ccs. or 8 g.) of acrylonitrile. To the solution is added only $2 \times 10^{-2}$ mol of initiator per litre. The following results are obtained.

| Exposure time in minutes: | Amount of polymer in percent by weight |
|---|---|
| 60 | 14 |
| 120 | 25 |
| 180 | 29.25 |
| 240 Very high. | |

Example 6

In a glass tube 3 g. of acrylamide are dissolved in 10 ccs. of methanol. To this solution is added as an initiator $2 \times 10^{-2}$ mol of α-naphthoic-methyldithiocarbamic anhydride per litre. After having sealed the glass tube by melting it is irradiated by means of a 300 watt high pressure mercury vapour lamp placed at a distance of 18 cm. After an exposure time of 1 hour 8.5% by weight of acrylamide had polymerised.

Example 7

Example 1 is repeated, after the initiator has been replaced by a same amount of benzoic-ethyldithiocarbamic anhydride. Exposure is carried out by means of a 300 watt high pressure mercury vapour lamp placed at a distance of 18 cm. The results are the following:

| Exposure time in minutes: | Amount of polymer in percent by weight |
|---|---|
| 60 | 17.1 |
| 135 | 21.7 |
| 180 | 22.7 |
| 240 | 34.8 |
| 300 | 49.75 |

Example 8

Example 1 is repeated after the initiator has been replaced by a same amount of benzoic-dimethyldithiocarbamic anhydride. Exposure is carried out by means of a 300 watt high pressure mercury vapour lamp placed at a distance of 18 cm. The results are the following:

| Exposure time in minutes: | Amount of polymer in percent by weight |
|---|---|
| 60 | 8 |
| 120 | 16 |
| 180 | 26 |
| 240 | 31 |

Example 9

Example 1 is repeated, but now the exposure is carried out for 5 hours by means of a tungsten lamp of 300 watt placed at a distance of 20 cm. In this case only wavelengths of above 4000 A. are used. Yield of polymer: 27.2% by weight.

What we claim is:

1. Process for the photopolymerisation of ethylenically unsaturated organic compounds, which comprises irradiating with light of wavelengths ranging from 2500 to 5000 angstroms a composition comprising a photopolymerisable ethylenically unsaturated organic compound and as a photopolymerisation initiator a carboxylic dithiocarbamic anhydride of the formula:

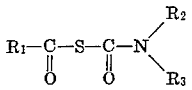

wherein:

$R_1$ is a phenyl group, a naphthyl group, or a styryl group, and each of $R_2$ and $R_3$ is hydrogen, methyl or ethyl.

2. Process according to claim 1, wherein th ephotopolymerisation initiator is present in an amount within the range of 0.01 to 5% by weight based on the ethylenically unsaturated organic compound present.

3. Process according to claim 1, wherein the photopolymerisation initiator is benzoic-methyldithiocarbamic anhydride.

4. Process according to claim 1, wherein the photopolymerisation initiator is α - naphthoic - methyldithiocarbamic anhydride.

5. Process according to claim 1, wherein the photocopolymerisation initiator is cinnamic - methyl - dithiocarbamic anhydride.

6. Process according to claim 1, wherein the photopolymerisation initiator is benzoic - dimethyldithiocarbamic anhydride.

7. Process according to claim 1, wherein the photopolymerisation initiator is benzoic - ethyldithiocarbamic anhydride.

8. Process according to claim 1, wherein the light used for irradiating the ethylenically unsaturated organic compounds is ordinary daylight.

References Cited

UNITED STATES PATENTS 2,716,633 8/1955 Englehardt et al. ---- 204—159.24
2,769,777 11/1956 Birum et al. ------- 204—159.24

MURRAY TILLMAN, *Primary Examiner.*

RICHARD B. TURER, *Assistant Examiner.*

U.S. Cl. X.R.

96—115; 204—159.15, 159.16, 159.17

UNITED STATES PATENT OFFICE
CERTIFICATE OF CORRECTION

Patent No. 3,429,795 February 25, 1969

Gerard Albert Delzenne et al.

It is certified that error appears in the above identified patent and that said Letters Patent are hereby corrected as shown below:

Column 2, line 41, "photopolymersiable" should read -- photopolymerisable --. Column 5, second table, first column, line 4 thereof, cancel "Very high." and insert the same in second column, same line 4. Column 6, lines 25 to 29, the formula should appear as shown below:

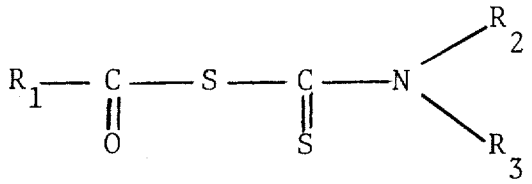

lines 34 and 35, "th ephotopolymerisation" should read -- the photopolymerisation --.

Signed and sealed this 18th day of November 1969.

(SEAL)
Attest:

EDWARD M.FLETCHER,JR.
Attesting Officer

WILLIAM E. SCHUYLER, JR.
Commissioner of Patents